(12) United States Patent
Crotty et al.

(10) Patent No.: US 10,770,055 B2
(45) Date of Patent: Sep. 8, 2020

(54) THERMAL/ACOUSTICAL LINER

(71) Applicant: Cocoon, Inc., North Hampton, NH (US)

(72) Inventors: Mark Crotty, Rye, NH (US); Katherine A. McNamara, West Newbury, MA (US); Leo J. Crotty, New Castle, NH (US)

(73) Assignee: L&C PROTEC, INC., North Hampton, NH (US)

(*) Notice: Subject to any disclaimer, the term of this patent is extended or adjusted under 35 U.S.C. 154(b) by 403 days.

(21) Appl. No.: 15/714,400

(22) Filed: Sep. 25, 2017

(65) Prior Publication Data

US 2018/0090123 A1 Mar. 29, 2018

Related U.S. Application Data

(63) Continuation-in-part of application No. 14/186,355, filed on Feb. 21, 2014, now abandoned.

(Continued)

(51) Int. Cl.
*G10K 11/168* (2006.01)
*B32B 27/08* (2006.01)
(Continued)

(52) U.S. Cl.
CPC ........... *G10K 11/168* (2013.01); *B32B 5/022* (2013.01); *B32B 27/08* (2013.01); *B32B 27/12* (2013.01); *B32B 27/14* (2013.01); *B32B 27/285* (2013.01); *B32B 27/322* (2013.01); *B32B 27/34* (2013.01); *B64C 1/066* (2013.01); *B64C 1/40* (2013.01); *H05K 9/0079* (2013.01); *B32B 2250/05* (2013.01); *B32B 2255/10* (2013.01);
(Continued)

(58) Field of Classification Search
CPC ....... G10K 11/168; B32B 27/08; B32B 27/34; B32B 27/285; B32B 27/322; B32B 5/022; B64D 2045/009; B64C 1/066
See application file for complete search history.

(56) References Cited

U.S. PATENT DOCUMENTS 6,065,153 A * 5/2000 Underwood ........... A41D 27/04
2/93
7,259,117 B2 * 8/2007 Mater .................. A47C 31/001
442/414

(Continued)

*Primary Examiner* — Jeremy R Pierce
(74) *Attorney, Agent, or Firm* — Bourque & Associates

(57) ABSTRACT

A multi-layer liner material for use as a thermal and acoustical insulator which is lightweight, breathable, hydrophobic, oleophobic and fire-resistant. A central insulation core layer is contacted on a first surface by a first highly breathable layer and on a second surface by a second highly breathable layer, such that these three layers are resistant to water or oil penetrating the insulation core layer causing the liner to gain weight. The first and second highly breathable layers are preferably made from inherently flame resistant fibers and treated with a fluorocarbon surface treatment for water repellency, UV resistance and mold/mildew resistance. The first highly breathable layer is adjacent a facing layer while the second highly breathable layer is adjacent a backing layer. At least one surface of one of the first or second highly breathable layers, or facing or backing layers may include a carbon printing pattern to provide ESD protection.

22 Claims, 1 Drawing Sheet

Related U.S. Application Data

(60) Provisional application No. 61/767,443, filed on Feb. 21, 2013.

(51) Int. Cl.

| | | |
|---|---|---|
| *B32B 27/34* | (2006.01) | |
| *B32B 27/28* | (2006.01) | |
| *B32B 27/32* | (2006.01) | |
| *H05K 9/00* | (2006.01) | |
| *B64C 1/40* | (2006.01) | |
| *B64C 1/06* | (2006.01) | |
| *B32B 5/02* | (2006.01) | |
| *B32B 27/14* | (2006.01) | |
| *B32B 27/12* | (2006.01) | |
| *B64C 1/00* | (2006.01) | |
| *B64D 45/00* | (2006.01) | |

(52) U.S. Cl.
CPC ....... *B32B 2255/20* (2013.01); *B32B 2262/02* (2013.01); *B32B 2262/0269* (2013.01); *B32B 2264/0257* (2013.01); *B32B 2307/102* (2013.01); *B32B 2307/21* (2013.01); *B32B 2307/304* (2013.01); *B32B 2307/3065* (2013.01); *B32B 2307/724* (2013.01); *B32B 2307/73* (2013.01); *B32B 2605/18* (2013.01); *B64C 2001/0072* (2013.01); *B64D 2045/009* (2013.01); *Y02T 50/46* (2013.01)

(56) References Cited

U.S. PATENT DOCUMENTS

| | | | |
|---|---|---|---|
| 2002/0070074 A1* | 6/2002 | Bongiovi, Jr. | B32B 5/18 181/207 |
| 2007/0009679 A1* | 1/2007 | Holcombe | F41H 3/02 428/17 |
| 2009/0110919 A1* | 4/2009 | Panse | B32B 5/18 428/339 |
| 2009/0111345 A1* | 4/2009 | Panse | D06M 11/74 442/138 |
| 2011/0099675 A1* | 5/2011 | Parks | A41D 13/0512 2/2.5 |
| 2012/0321868 A1* | 12/2012 | Richardson, III | B32B 5/18 428/216 |
| 2015/0298440 A1* | 10/2015 | Crotty | B32B 27/14 442/397 |

* cited by examiner

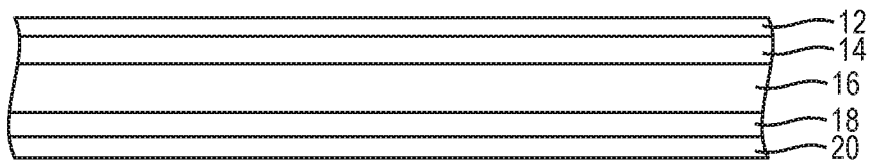

THERMAL/ACOUSTICAL LINER

CROSS-REFERENCE TO RELATED APPLICATIONS

This application is a continuation-in-part of U.S. patent application Ser. No. 14/186,355 titled Thermal/Acoustical Liner filed Feb. 21, 2014 and claims priority from U.S. Provisional Patent Application No. 61/767,443 entitled "Thermal/Acoustical Liner For Cargo Aircraft", filed on Feb. 21, 2013 both of which are incorporated fully herein by reference.

TECHNICAL FIELD

The present invention relates to a thermal acoustical liner for use, for example, in aircraft and other similar environments.

BACKGROUND INFORMATION

Current thermal acoustical liners, for example those used in aircraft, suffer from various performance issues. The liners tend to trap moisture and contaminants, such as water, oil, sand, dust and pollutants against the air frame of the aircraft. These liners are not breathable/air permeable and this leads to accelerated corrosion damage.

The liners currently used also add more weight to the aircraft than should be required in order to deliver the necessary sound deadening and thermal insulation performance requirements. For example, the build out of an existing liner (in terms of weight/square yard) is as follows: the face fabric is 14-18 oz/yard (PVC coated polyester), the microlite fiberlite AA insulation is 0.60 lb/cu. ft. or approximately 7.2 oz./sq. yd, a 1.0 oz vinyl barrier, a 2.0 oz. backing fabric, and an additional 2.0 oz due to the quilting process result in a total (not including attachment means) of 26-30 oz. total dry weight per square yard, or roughly 163-188 lbs per 100 sq. yards (typical aircraft application . . . such as a Chinook helicopter).

Additionally, the existing liners absorb moisture and hydrocarbon contaminants in the field, which adds significant additional weight to the aircraft when in use, as much as 50% or 81-94 lbs. per 100 sq. yards. Additionally, the thermal and acoustical performance of current liners is limited due to limitations of fiberglass insulation and the quilting assembly that is required, compressing the insulation and degrading its thermal and acoustic properties. Additionally, the fiberglass insulation fibers breakdown/degrade due to vibration (breakdown and compression of fiberglass) and absorption of moisture and oil/fuel contaminates. As the liner becomes contaminated with dust, lubricants, fuel, hydraulic fluid, a fire hazard can be created.

Accordingly, what is needed is a Thermal Acoustical liner material that does not trap moisture or contaminates, that allows for breathability/air permeation to prevent corrosion due to trapped moisture/condensation against the air frame, which is lightweight, which has improved thermal and acoustical performance, which can dissipate static charges rapidly, and which reduces the fire hazard.

SUMMARY

The present invention features a multi-layer liner that comprises a high performance, Fire Resistant (FR), nonwoven, amorphous thermoplastic polyetherimide, (PEI) resin (or equivalent) insulation core layer with an upper surface and a lower surface; a first, high strength (high tear, tensile, and abrasion performance) highly breathable layer located on the upper surface of the insulation core layer, the first highly breathable, waterproof, filter layer constructed from an ePTFE membrane or equivalent; a second highly breathable layer located on the lower surface of the insulation core layer, the second highly breathable, waterproof, filter layer constructed from an ePTFE membrane or equivalent; a facing layer located on the first highly breathable layer, wherein the facing is constructed from a material that is fire-resistant; and a backing layer located on the second highly breathable later, wherein the backing is a highly breathable, fire-resistant rated material, wherein the layers of the liner are connected to one another with an adhesive lamination process. In the preferred embodiment, at least one of the facing layer and the backing layer is treated with an appropriate nanoscopic coating to provide the waterproof characteristics desired.

The entire thermal acoustical liner system dissipates static charges through the use of an electrostatic dissipative carbon printed on the inside of both the face and backing layers of the lamination. The system is assembled by laminating the layers together in a 3 dimensional blanket that is not compressed or punctured. The entire liner system is approximately 30% lighter than the existing design and does not gain significant weight in use.

It is important to note that the present invention is not intended to be limited to a system or method which must satisfy one or more of any stated objects or features of the invention. It is also important to note that the present invention is not limited to the preferred, exemplary, or primary embodiment(s) described herein. Modifications and substitutions by one of ordinary skill in the art are considered to be within the scope of the present invention.

BRIEF DESCRIPTION OF THE DRAWINGS

These and other features and advantages of the present invention will be better understood by reading the following detailed description, taken together with the drawings wherein:

FIG. 1 is a detailed cross-sectional view of the multi-layer liner according to one embodiment of the present invention;

DETAILED DESCRIPTION OF THE PREFERRED EMBODIMENTS

The present invention features a thermal acoustical liner 10, FIG. 1, which is breathable, hydrophobic, oleophobic and fire-resistant. The liner is intended for use in a cargo aircraft on the interior airframe of the aircraft to help deaden acoustical noise coming from the airframe, although other uses are contemplated and within the scope of the present invention. The liner includes multiple layers, which are laminated to one another.

The acoustical liner 10 includes a facing layer 12 that is highly breathable and fire-resistant rated. The facing layer faces the interior (passenger and/or cargo) region of the aircraft. The facing layer 12 provides resistance to oil and water resistance exhibiting resistance to water entry pressures greater than 10 m water column and a surface oil resistance preventing the ingress of oils and other contaminants with surface tensions greater or above 21 dynes/cm and hydrophobic (resistant to water entry pressure) to a level of at least 10 m water column imparting these characteristics to the entire 5 layer laminated thermal/acoustical liner. The facing 12 is preferably a combination of rayon, nylon and aramid/para-aramid woven fabric which has high strength and durability and light weight. In an alternative embodiment the facing 12 uses woven knitted or nonwoven materials made from inherently flame and/or fire resistant without chemical treatment and/or thermally stable materials.

The facing 12 may also be treated with a fluorocarbon surface treatment for water repellency, UV resistance and mold/mildew resistance. An alternative embodiment uses woven, knitted or nonwoven materials that are inherently flame retardant materials or by their polymer make-up do not support combustion. Such materials can be aramid/para-aramid, polyimide, polyamidimide, fluoropolymer, melamine, glass and any other known fabric material that does not support combustion. Further the materials shall not be treated with flame retardant treatments which give off potentially toxic or harmful vapors upon combustion or thermal degradation. Examples of toxic or harmful vapors, their maximum allowable concentrations and the test results of the invention are listed in Table I.

The facing 12 is in contact with a first highly breathable layer 14. The first highly breathable layer 14 is preferably an ePTFE membrane. Being made from ePTFE is desirable in that the material of the first highly breathable layer 14 is thermally stable and inherently flame retardant which therefore adds to the overall inherent flame resistance of the 5 layer design. The ePTFE material exhibits an air permeability of 0.10 CFM to allow moisture vapor to pass through the 5 layer design at a rate of 3500 g/m$^2$/24 hr or greater, while maintaining a resistance to water entry pressure of at least a 10 m water column and also blocking or preventing the insulation core layer 16 from retaining water and oil, as well as sand/dust and other contaminates down to 0.3 microns. The concept is not limited to ePTFE films but may also utilize any air permeable layer offering water repellency performance made from polyurethane or polyolefin.

An insulation core layer 16 contacts the first highly breathable layer 14. The insulation core layer 16 is breathable, hydrophobic and fire-resistant. The insulation core layer 16 is preferably a nonwoven polyetherimide (Ultem) Resin blended layer that is highly air permeable, hydrophobic and oleophobic and which provides improved core thermal and acoustical performance characteristics vs. existing fiberglass cores. Preferably the insulation core layer will be constructed with a combination of fibers of one or more deniers such that it provides sufficient bulk to provide the desired thermal insulation and sufficient surface area and volume to provide the desired sound attenuation properties. In addition to the attributes above, a nonwoven material is preferred for its flexibility and stability to vibration. It is desirable to use a flexible material so that the multi-layer liner can easily be removed, either fully or partially, while the aircraft, or vehicle, is in flight to inspect behind the liner. Ultem Resins are a group of amorphous thermoplastic polyetherimide (PEI) resins with elevated thermal resistance, high strength and stiffness, and broad chemical resistance. The insulation core layer 16 passes all required fire-resistance and smoke requirements. In an alternative embodiment the insulation core layer 16 uses woven, knitted or non-woven materials that are inherently flame retardant materials without chemical treatment or by their polymer make up do not support combustion (again without chemical treatment) and do not give off any of a plurality of known toxic or harmful vapors upon combustion or thermal degradation such as an amorphous polysilicic acid drawn from SiO2 material, such as Belchem fiber, or oxidized polyacrylonitrile, such as CarbonX or similar inherently flame retardant materials. Materials chosen must be durable to vibrational integrity testing MIL-STD-810G method 514.6, Procedure I without needing to be quilted or other means for preventing fiber migration.

A second embodiment includes the use of a non-woven aramid/para-aramid fiber core (such as Dupont Kevlar®), replacing the Ultem, to provide both the thermal and acoustical characteristics required, the light weight characteristic and the ability of the liner to provide "ballistic or shrapnel protection" for the sides of the aircraft.

The insulation core layer 16 contacts a second highly breathable layer 18. The second highly breathable layer 18 is preferably an ePTFE membrane. Being made from ePTFE is desirable in that the material of the second highly breathable layer 18 is thermally stable and inherently flame retardant which therefore adds to the overall inherent flame resistance of the 5 layer design. The ePTFE material exhibits an air permeability of 0.10 CFM to allow moisture vapor to pass through the five layer design at a rate of 3500 g/m$^2$/24 hr, while maintaining a resistance to water entry pressure of at least a 10 m water column and also blocking or preventing the insulation core layer 16 from retaining water and oil, as well as contaminates down to 0.3 microns. The concept is not limited to ePTFE films but may also utilize any air permeable layer offering water repellency performance made from polyurethane or polyolefin. Further the materials shall not be treated with flame retardant treatments which could give off potentially toxic or harmful vapors upon combustion or thermal degradation. Examples of toxic or harmful vapors, their maximum allowable concentrations and the test results of the invention are listed in Table I.

The second highly breathable layer 18 contacts a backing layer 20, which is designed to face or contact the airframe of an aircraft. The backing 20 is a highly breathable, fire-resistant rated material. The backing 20 is preferably combination of rayon, nylon and aramid/para-aramid knitted fabric. In an alternative embodiment the backing layer 20 uses woven, knitted or nonwoven materials made from inherently flame resistant or thermally stable materials. The backing 20 may also be treated with a fluorocarbon surface treatment for water repellency, UV resistance and mold/mildew resistance. The backing 20 must provide resistance to oil and water resistance with the overall 5 layer design have resistance to water entry pressures greater than 10 m of water and a surface oil resistance preventing the ingress of oils and other contaminants with surface tensions greater or above 21 dynes/cm. An alternative embodiment uses woven, knitted or nonwoven materials that are inherently flame retardant materials or by their polymer make up do not support combustion. Such materials can be aramid/para-aramid, polyimide, polyamidimide, fluoropolymer, melamine, glass and any other known fabric material that does not support combustion. Further the materials shall not be treated with flame retardant treatments which could give off potentially toxic or harmful vapors upon combustion or thermal degradation. Examples of toxic or harmful vapors, their maximum allowable concentrations per test method BSS 7239 are listed in Table I. The test results of the overall 5-layer design are listed in Table I. The test results of the invention are shown under the right-hand "Liner Material Results" column.

TABLE I

| Compound | Maximum Allowable (ppm) | Liner Material Results |
| --- | --- | --- |
| CO | 3,500 | <10.0 |
| HF | 200 | <0.5 |
| HCl | 500 | <1.0 |
| HCN | 150 | <0.5 |
| $SO_2$ | 100 | <1.0 |
| $NO/NO_2$ | 100 | <2.0 |

The multi-layered liner is designed to address all major performance deficiencies found in prior art liners. Some of the major deficiencies of prior art liners include, but are not limited to; low or no air permeability and breathability, gaining weight over time through the absorption of fluids, and electrostatic discharge below "good" performance level. A deficient level of air permeability and breathability has been found to trap moisture between the thermal acoustical liner and the airframe or vehicle structure leading to an excessive rate of corrosion. Gaining weight over time is of particular concern in the field of aviation where increased weight, particularly weight that is not directly accounted for, leads to issues of fuel consumption and load capacity which are both potentially dangerous. Even more dangerous is the previously flame retardant insulation liner material absorbing highly flammable oils and fuels present in an airframe to such an extent that it no longer serves its purpose in the event of a fire.

The liner 10 will also preferably include electro-static discharge (ESD) performance. For example, preferably 1.0 second or better discharge of a 5000 volt charge is achieved using the federal rating and test method specified in Federal standard 191A method 5931. In a further preferred embodiment the electro-static discharge will be 0.2 second or better. This level would achieve a classification of "Good" or "Excellent" for static dissipative classification using the federal rating and test method specified in FTTS-FA-009. In one embodiment, the ESD performance is achieved by utilizing a carbon impregnated ePTFE in at least one of the first and/or second highly breathable layers 14/18. In another embodiment, the ESD performance is achieved by using a carbon printing pattern on at least one surface interior of the facing 12 or backing 20 as is described in Patent U.S. Pat. No. 9,204,525 B2, or one of the first and/or second highly breathable layers 14/18. The carbon printing pattern is preferably located on the surface of the facing 12 that comes in contact with the first highly breathable layer 14 or the surface of the backing 20 that comes in contact with the second highly breathable layer 18. In the preferred embodiment, the multi-layer liner provides electro-static discharge (ESD) performance characteristics in the range of 1-100 MOhm when tested with 500 volts potential as per DIN test method 54345 or at most a 0.2 second discharge time for 5000 volt charge when applied to either the facing or backing as per FED 191A method 5931.

The laminated multi-layer thermal/acoustical liner also improves on corrosion prevention by maintaining a permanent barrier to water and oil and retaining high breathability (air permeability of 0.10 CFM and MVTR of 3500 $g/m^2/24$ hr), thereby assuring that moisture and water does not penetrate the liner and become trapped against the airframe and the electronic and hydraulic systems located against the airframe. Preventing water from coming in contact with the airframe reduces corrosion by reducing the water/electrolyte contact with the air-frame and preventing oxidation. Further, the high moisture vapor transport rate ensures that any moisture on the airframe can escape through the material. Using the previously mentioned 100 square yards typical for an aircraft application and a value of 3500 $g/m^2/24$ hr it is straightforward to calculate an overall moisture vapor transmission of 292 kilograms or 645 pounds for one aircraft in one period of 24 hours. This leads to a significant reduction in moisture near the airframe thereby reducing the rate of corrosion. The liner of the present invention is an effective barrier/filter to contaminates (sand, dust, and pollutants like salts and sulfurs) down to 0.3 microns and also does not support the growth of mold or mildew. The first and second highly breathable layers 14/18 of the liner mitigate corrosion. When an ePTFE barrier membrane is used, the liner is highly breathable and will not hold or trap moisture against the air frame or within the core insulation.

The liner of the present invention features improved thermal and acoustical performance. The liner delivers an R 3.5 insulating value, which improves on the R 1.8 insulating value of prior art liners after quilting. The increase in thermal performance of the liner of the present invention represents a 100% increase over prior art liners of a similar weight per unit area or increase thereof. In this way the present invention represents an increase in thermal insulation performance per unit weight. The liner of the present invention also maintains thermal insulation over time by being resistant to losing the loft or thickness of the overall product whereas prior art liners have been known to degrade due to vibrational frequencies common in aircraft such as helicopters. The liner is made resistant to losing loft over time through careful selection of the fibers that it is made from, their material makeup and sizing. Proper sizing of the fibers aids in the thermal insulation and has also been found to be critical to the acoustical performance. Sound attenuation was maximized at a blend of 20% 2 denier fibers and 80% 8 denier without sacrificing product stability. The present invention provides acoustical performance of 10% or better across the entire relevant sound wave spectrum, than the currently available liners. Anechoic testing has shown the liner to reduce sound transmission across a range of frequencies. More specifically it has been shown to reduce sounds in the 250-1,000 Hz range by 10 dB and sounds in the 1,000 to 10,000 Hz range by 20 dB. Compared to previous technologies this represents an increase in performance of 30-100%.

TABLE II

| Product | Transmission Loss 250-1,000 Hz | Transmission Loss 1,000-10,000 Hz |
| --- | --- | --- |
| Present Invention | 10 dB | 20 dB |
| Existing Technology | 7 dB | 10 dB |

Assembly and connection of the layers of the liner is achieved through lamination, not by quilting as is done in prior art liners. Quilting tends to destroy the performance of the liner because the quilting process compacts the insulation layer and creates holes in the surface which allow water and oil to penetrate the liner. When the insulation is compacted, the insulative value (R value) decreases and its acoustical performance is degraded and the compacted insulation has an increased tendency to hold water and other contaminates due to the multiple punctures created by quilting. The nonwoven, fire resistant (FR), air permeable, hydrophobic and oleophobic thermal and acoustical insulation core is constructed at least in part from one or more materials selected from the group of materials consisting of a non-woven, amorphous thermoplastic polyetherimide (PET) resin material or an amorphous polysilicic acid drawn from SiO2 material or oxidized polyacrylonitrile or similar that are able to pass vibrational integrity testing MIL-STD-810G method 514.6, Procedure I, without needing quilting or other means for preventing fiber migration.

In contrast, the present invention uses a lamination process that can be accomplished using a FR polyurethane (PU) adhesive or via thermal welding or binding. The lamination process is a four step process that builds up the component layers one at a time by bonding the individual layers together in a roll/heat/pressure/adhesive based process. The final laminated system is approximated 1 inch thick, or less, without interruptions, punctures or compressions (does not to degrade performance). The laminated system maintains high breathability/air permeation characteristics. Lamination also allows for in field repairs due to the uninterrupted flat surfaces of both the face and backing fabrics. The surfaces allow patch kits with adhesive backings to be applied and successfully bond providing an effective repair that cannot be achieved on irregular quilted surfaces.

As a final process the present invention goes through a plasma based treatment process to durably apply nano fluorocarbons throughout the previously mentioned 5 layer design. This process ensures even application and penetration of all layers. The fluorocarbon treatment is added to ensure that all layers are hydrophobic as well as oleophobic to resist the penetration or contamination by water and oils. In an alternative embodiment each individual layer is treated with fluorocarbons to render each layer oleophobic and hydrophobic. In a further alternative embodiment the 5 layer design is rendered oleophobic and hydrophobic through a pad bath or dip process application of fluorocarbons, or some combination of the aforementioned various methods of fluorocarbon application as they pertain to each layer or the overall 5 layer design. By rendering the liner oleophobic and hydrophobic it will resist the absorption of fluids and thereby weight gain. When testing for weight gain by a one minute soak in water on both facing and backing layers followed by a 5 minute drip dry the material will gain less than 5% of its original weight. By not absorbing water, it will also therefore be resistant to the growth of mold and mildew, as the moisture content needed to support growth will not be present in the liner. Test specimens showed no visible evidence of fungal growth when tested according to MIL-STD-810G Method 508.6 84 day exposure, Fungus: Mold culture media (PDA and mineral salts agar).

The liner also features a lower dry weight that the prior art, with the liner preferably reducing the dry weight by 30%. An example of the product build out (in weight per square yard) for the multi-layer liner is as follows: a face fabric of 4.0-5.5 oz. nylon (facing layer 12), 0.25 oz ePTFE (first highly breathable layer 14), an insulation layer of Ultem nonwoven 1 inch 9.0 oz/sq. yd. (insulation core layer 16), 0.25 oz. ePTFE (second highly breathable layer 18), 1.5 oz of backing fabric (backing layer 20), as well as 1.0 oz. added as a result of the lamination and printing processes, for a total (without attachment means) of 16.0-17.5 oz. of total dry weight, or approximately 112.5 lbs. per 100 sq. yards (typical aircraft application . . . such as a Chinook helicopter). This reduced weight saves approximately 8 oz. per yard over the prior art liners (the composition and weight of the prior art liner is described in detail in the background).

The present invention provides for a reduction in dry weight versus the existing fabric, which is estimated at 163 lbs/100 square yards versus the new liner which is 113 lbs/100 square yards. This reduction is approximately 50 lbs reduced weight for 100 square yards (approximately the amount of material to cover the airframe of a cargo aircraft such as a Chinook), which is approximately a 30% drop in weight per aircraft from the prior art liner to the liner of the present invention.

Also important is the weight difference between prior art liners and the liner of the present invention once the liner has been installed for a period of time. The liner of the present invention eliminates weight gain while the liner is in use (due to the accumulation of water, moisture, oil/fuel and other contaminates into the liner) and preferably obtains a maximum gain of 5% weight once saturated/aged. In the preferred embodiment, the laminated, multi-layer liner is treated with a continuous gas plasma process utilizing nano fluorocarbons, assuring penetrations through all 5 layers of the laminated multi-layer liner such that the multi-layer liner absorbs less than 5% of the dry weight when tested by a 1 minute soak in water on both facing and backing layers followed by a 5 minute drip dry. Further, the nano fluorocarbon treatment will render the multi-layer liner resistant to mold and mildew growth as tested by MIL-STD-810G, Method 508.6, 84 day exposure. Prior art liners gain significant over time weight from water, oils and other contaminants. Existing liners can gain 50% of their original weight, causing a 163 lb liner to weigh 245 lbs over time. The combination of the layers and assembly method used in the liner of the present invention is such that the liner does not absorb the water, oils and contaminants as occurs with prior art liners. Since the liner of the present invention does not absorb water, oils and contaminants, the liner has been shown to exhibit only a 5% gain in weight over the same time period as the prior art liners, resulting in a liner that weighs approximately 124 lbs. This has been shown in actual use of an operational U.S. Army CH-47F Chinook helicopter as well as in lab testing by weighing the liner in a conditioned environment followed by a 1 minute soak on each face in water before a 5 minute drip dry to determine the saturated weight.

Although the multi-layer liner is described in terms of use in aircraft, as a liner, it is contemplated and within the scope of the present invention that the liner could be used for many other purposes. For example, the multi-layer liner could be used in watercraft, automobiles, military vehicles, or anywhere where traditional liners suffer from the performance issues outlined above.

The present invention creates a multi-layered liner material that addresses all of the problems encountered in the prior art. The liner of the present invention reduces the initial weight and weight over time of the liner, the liner reduces corrosion to the air frame by preventing moisture build up behind the liner (see FIG. 3), the liner increase thermal and acoustical performance, and the process of creating the liner through lamination creates a product that is superior and easier to fix that the prior art. The liner of the present invention preferably has a five year design life, is field repairable, is resistant to mold and mildew, is fire-resistant and is also ESD rated. The multi-layer liner exhibits a smoke specific optical density of less than 200 when tested to FAR 25.853 appendix F part V and combustion toxicity is less than 25% of the maximum allowable values according to BSS 7239. Further, the material shall pass these tests without the use of any brominated or Tris flame retardants.

Modifications and substitutions by one of ordinary skill in the art are considered to be within the scope of the present invention, which is not to be limited except by the allowed claims and their legal equivalents.

The invention claimed is:

1. A multi-layer, light weight and highly breathable/air permeable thermal/acoustical liner, said multi-layer liner comprising:
   a nonwoven, fire resistant (FR), air permeable, hydrophobic and oleophobic thermal and acoustical insulation core layer having an upper surface and a lower surface, said insulation core layer inherently fire resistant with no chemical treatment providing sound transmission loss of; at least 10 dB in the 250 to 1,000 Hz range, and 20 dB in the 1,000 to 10,000 Hz ranges and an insulation R value of 1.8 or greater;
   a first highly breathable, hydrophobic and oleophobic layer disposed proximate and adjacent said upper surface of said insulation core layer, said first highly breathable layer constructed from an ePTFE membrane, said first highly breathable, hydrophobic and oleophobic layer is hydrophobic to a level of at least 10 m water column;
   a second highly breathable, hydrophobic and oleophobic layer disposed proximate and adjacent said lower surface of said insulation core layer, said second highly breathable, hydrophobic and oleophobic layer hydrophobic to a level of at least 10 m water column;
   a facing layer disposed proximate and adjacent a surface of said first highly breathable layer that is opposite a surface that is proximate and adjacent said insulation core layer, wherein said facing is constructed from a material that is highly breathable and fire-resistant, said facing layer comprised of a hybrid of fire-resistant combination of rayon, nylon and aramid/para-aramid configured to provide inherent fire resistance with no chemical treatment; and
   a backing layer disposed proximate and adjacent a surface of said second highly breathable layer that is opposite a surface that is proximate and adjacent said insulation core layer, wherein said backing is a highly breathable, fire-resistant material, said backing layer comprised of a hybrid of fire-resistant combination of rayon, nylon and aramid/para-aramid configured to provide inherent fire resistance with no chemical treatment, and wherein said insulation core, said first highly breathable layer, said second highly breathable layer, said facing and said backing layers of said multi-layer liner are laminated to one another, and wherein said laminated multi-layer liner exhibits air permeability of 0.10 CFM or greater and MVTR of 3500 g/m$^2$/24 hr once laminated together.

2. The multi-layer liner according to claim 1, wherein said first highly breathable layer and said second highly breathable layers exhibit air permeability of 0.10 CFM or greater and MVTR of 3500 g/m$^2$/24 hr and are inherently fire resistant.

3. The multi-layer liner according to claim 1, wherein said first and second highly breathable layers are resistant to oil and hydrophobic to a level of at least 10 m water column, protecting the thermal and acoustical insulation layer from contamination by fluids and particulates, down to 0.3 microns, which could lead to weight gain and further performance degradation.

4. The multi-layer liner according to claim 1 wherein the multi-layer liner is not treated with any brominated or Tris flame retardants and wherein said multi-layer liner exhibits a smoke specific optical density of less than 200 when tested to FAR 25.853 appendix F part V and a combustion toxicity of less than 25% of the maximum allowable values according to BSS 7239.

5. The multi-layer liner according to claim 1, wherein said laminated, multi-layer liner is treated with a continuous gas plasma process utilizing nano fluorocarbons, assuring penetrations through all 5 layers of the laminated multi-layer liner such that the multi-layer liner absorbs less than 5% of the dry weight when tested by a 1 minute soak in water on both facing and backing layers followed by a 5 minute drip dry and wherein said nano fluorocarbon treatment is configured to render the nano fluorocarbon treated multi-layer liner resistant to mold and mildew growth as tested by MIL-STD-810G, Method 508.6, 84 day exposure.

6. The multi-layer liner according to claim 1, wherein said nonwoven, fire resistant (FR), air permeable, hydrophobic and oleophobic thermal and acoustical insulation core is constructed at least in part from one or more materials selected from the group of materials consisting of: a nonwoven, amorphous thermoplastic polyetherimide (PEI) resin material, an amorphous polysilicic acid drawn from SiO2 material, an oxidized polyacrylonitrile material, and a para-aramid fiber that are able to pass vibrational integrity testing MIL-STD-810G method 514.6, Procedure I without needing quilting or other means for preventing fiber migration.

7. The multi-layer liner according to claim 1, wherein said multi-layer liner includes means for providing electro-static discharge (ESD) performance characteristics in the range of 1-100 MOhm when tested with 500 volts potential as per DIN test method 54345 or at most a 0.2 second discharge time for 5000 volt charge when applied to either the facing or backing as per FED 191A method 5931.

8. The multi-layer liner according to claim 7, wherein said means for providing electro-static discharge (ESD) performance characteristics to said multi-layer liner includes providing both of said first and second highly breathable layers with a carbon impregnated ePTFE material.

9. The multi-layer liner according to claim 7, wherein said means for providing electro-static discharge (ESD) performance characteristics to said multi-layer liner includes providing both of said first and second highly breathable layers with a carbon printing pattern on at least an interior surface of said first and second highly breathable layers.

10. The multi-layer liner according to claim 9, wherein said means for providing electro-static discharge (ESD) performance characteristics to said multi-layer liner includes providing both of said facing layer and said backing layer with a carbon printing pattern on an interior surface of at least one of the facing layer and the backing layer, and wherein said interior surface of said facing layer including said carbon printing pattern is located on a surface of the facing layer that contacts the first highly breathable layer, and wherein said interior surface of the backing layer that contacts the second highly breathable layer is located on a surface of the backing layer that contacts the second highly breathable layer.

11. A multi-layer, light weight and highly breathable/air permeable thermal/acoustical liner, said multi-layer liner comprising:
   a nonwoven, fire resistant (FR), air permeable, hydrophobic and oleophobic thermal and acoustical insulation core layer having an upper surface and a lower surface, said insulation core layer inherently flame resistant with no chemical treatment and hydrophobic to a level of at least 10 m water column;

a first highly breathable, hydrophobic and oleophobic layer disposed proximate and adjacent said upper surface of said insulation core layer, said first highly breathable layer constructed from an ePTFE membrane, said first highly breathable, hydrophobic and oliophobic layer is hydrophobic to a level of at least 10 m water column;

a second highly breathable, hydrophobic and oleophobic layer disposed proximate and adjacent said lower surface of said insulation core layer, said second highly breathable layer constructed from an ePTFE membrane said second highly breathable, hydrophobic and oliophobic layer hydrophobic to a level of at least 10 m water column;

a facing layer disposed proximate and adjacent a surface of said first highly breathable layer that is opposite a surface that is proximate and adjacent said insulation core layer, wherein said facing is constructed from a material that is highly breathable and fire-resistant, said facing layer comprised of a hybrid of fire-resistant rayon, nylon and a para-aramid synthetic fiber configured to provide inherent fire resistance with no chemical treatment, and wherein said facing layer is hydrophobic to a level of at least 10 m water column providing said hydrophobic characteristic to said multi-layer thermal/acoustical liner; and a backing layer disposed proximate and adjacent a surface of said second highly breathable layer that is opposite a surface that is proximate and adjacent said insulation core layer, wherein said backing is a highly breathable, fire-resistant material, said backing layer comprised of a hybrid of fire-resistant rayon, nylon and para-aramid configured to provide inherent fire resistance with no chemical treatment, and wherein said backing layer is hydrophobic to a level of at least 10 m water column providing said hydrophobic characteristic to said multi-layer liner, and wherein said insulation core, said first highly breathable layer, said second highly breathable layer, said facing and said backing layers of said multi-layer liner are laminated to one another, and wherein said laminated multi-layer liner exhibits air permeability of 0.10 CFM or greater and MVTR of 3500 g/m²/24 hr once laminated together.

12. The multi-layer liner according to claim 11, wherein said first highly breathable layer, said second highly breathable layer, said facing layer, said backing layer and said core exhibit air permeability of 0.10 CFM or greater and MVTR of 3500 g/24 hr and are inherently fire resistant, said exhibited air permeability including exposed to an elevated temperature caused by fire and/or heat.

13. The multi-layer liner according to claim 11, wherein said facing layer is resistant to oil.

14. The multi-layer liner according to claim 11, wherein said facing layer is constructed from a fabric comprising a hybrid of inherently fire resistant rayon, nylon and a para-aramid synthetic fiber.

15. The multi-layer liner according to claim 11, wherein at least one of said facing layer and said backing layer is treated with a nanoscopic coating.

16. The multi-layer liner according to claim 11, wherein said nonwoven, fire resistant (FR), air permeable, hydrophobic and oleophobic thermal and acoustical insulation core is constructed at least in part from one or more materials selected from the group of materials consisting of a non-woven, amorphous thermoplastic polyetherimide (PEI) resin material and an amorphous polysilicic acid drawn from $SiO_2$ material.

17. The multi-layer liner according to claim 11, wherein said insulation core is fabricated from one or more materials selected from the group of materials consisting of a non-woven, amorphous thermoplastic polyetherimide (PEI) resin material, an amorphous polysilicic acid drawn from $SiO_2$ material, and aramid fiber.

18. The multi-layer liner according to claim 11, wherein said multi-layer liner includes means for providing electro-static discharge (ESD) performance characteristics to said multi-layer liner.

19. The multi-layer liner according to claim 18, wherein said means for providing electro-static discharge (ESD) performance characteristics to said multi-layer liner includes providing both of said first and second highly breathable layers with a carbon impregnated ePTFE material.

20. The multi-layer liner according to claim 18, wherein said means for providing electro-static discharge (ESD) performance characteristics to said multi-layer liner includes providing at least one of said facing layer and said backing layer with a carbon printing pattern on at least an interior surface of one of said facing and backing layers.

21. The multi-layer liner according to claim 18, wherein said means for providing electro-static discharge (ESD) performance characteristics to said multi-layer liner includes providing both of said facing layer and said backing layer with a carbon printing pattern on an interior surface of at least one of the facing layer and the backing layer, and wherein said interior surface of said facing layer including said carbon printing pattern is located on a surface of the facing layer that contacts the first highly breathable layer, and wherein said interior surface of the backing layer that contacts the second highly breathable layer is located on a surface of the backing layer that contacts the second highly breathable layer.

22. The multi-layer liner according to claim 18, wherein said multi-layer liner provides ESD performance characteristics in the range of 1-100 MOhm when tested with 500 volts potential as per DIN test method 54345 or at least a 0.5 second discharge time for 5000 volt charge both facing and backing as per FED 191A method 5931.

* * * * *